United States Patent
Ku et al.

(10) Patent No.: US 11,316,475 B1
(45) Date of Patent: Apr. 26, 2022

(54) MIXER CIRCUIT

(71) Applicant: RichWave Technology Corp., Taipei (TW)

(72) Inventors: Po-Chih Ku, Taipei (TW); Tse-Peng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/372,557

(22) Filed: Jul. 12, 2021

(30) Foreign Application Priority Data

May 25, 2021 (TW) .................................. 110118858

(51) Int. Cl.
*H03D 7/14* (2006.01)
(52) U.S. Cl.
CPC ......... *H03D 7/1408* (2013.01); *H03D 7/1458* (2013.01)
(58) Field of Classification Search
CPC combination set(s) only.
See application file for complete search history.

(56) References Cited

U.S. PATENT DOCUMENTS

| | | |
|---|---|---|
| 6,275,689 B1 | 8/2001 | Gill |
| 7,013,122 B2 | 3/2006 | Gamliel |
| 8,666,354 B2 | 3/2014 | Jiang |
| 9,780,728 B1 * | 10/2017 | Salameh .............. H03D 7/1441 |
| 10,141,888 B2 | 11/2018 | Salameh |
| 11,075,604 B2 * | 7/2021 | Birkbeck ............. H03D 7/1408 |
| 2017/0302226 A1 | 10/2017 | Esmael et al. |
| 2021/0099130 A1 | 4/2021 | Birkbeck |

FOREIGN PATENT DOCUMENTS

| | | |
|---|---|---|
| CN | 201113924 | 9/2008 |
| CN | 109245727 | 1/2019 |
| RU | 2628209 | 8/2017 |
| TW | 201841204 | 11/2018 |

* cited by examiner

*Primary Examiner* — Long Nguyen
(74) *Attorney, Agent, or Firm* — JCIPRNET

(57) ABSTRACT

A mixer circuit including a mixer, a voltage divider circuit, and an amplifier, is provided. The mixer receives a first input signal, a second input signal, and at least one set of bias voltages, and generates an output signal. A frequency of the output signal is related to a frequency of the first input signal and a frequency of the second input signal. The voltage divider circuit receives the bias voltages and generates a common mode signal at an output end. The amplifier is coupled to the mixer to receive the output signal, and is coupled to the output end of the voltage divider circuit and configured to suppress noise in the output signal, and generate a final output signal.

20 Claims, 10 Drawing Sheets

MIXER CIRCUIT

CROSS-REFERENCE TO RELATED APPLICATION

This application claims the priority benefit of Taiwan application serial no. 110118858, filed on May 25, 2021. The entirety of the above-mentioned patent application is hereby incorporated by reference herein and made a part of this specification.

BACKGROUND

Technical Field

This disclosure relates to a communication technology, and in particular to a mixer circuit.

Description of Related Art

In communication fields such as wireless communication and radar, a signal has to be up-converted or down-converted for ease of propagation and processing. Therefore, a mixer becomes a basic element in a communication system.

However, an output signal of the mixer may include other unwanted DC interference and AC interference, which is a considerable design issue for the mixer.

SUMMARY

A mixer circuit of the disclosure includes a mixer, a voltage divider circuit and an amplifier. The diode mixer including multiple diodes receives the first input signal, the second input signal, and at least one set of bias voltages for forward biasing the multiple diodes, and generates an output signal. A frequency of the output signal is related to a frequency of the first input signal and a frequency of the second input signal. The voltage divider circuit receives the at least one set of bias voltages and generates a common mode signal at an output end. The amplifier has a first input end coupled to the diode mixer to receive the output signal, and a second input end coupled to the output end of the voltage divider circuit to suppress noise in the output signal and generate a final output signal.

To make the aforementioned more comprehensible, several embodiments accompanied with drawings are described in detail as follows.

DESCRIPTION OF THE EMBODIMENTS

This disclosure provides a double-balanced mixer using a low-cost diode, which can increase sensitivity of the double-balanced mixer through a dual-path bias voltage diode even when a diode with a higher turn-on voltage is used. In addition, the double-balanced mixer of the disclosure may omit disposition of a capacitor in an output end circuit, thereby reducing an area of the double-balanced mixer, and enabling the double-balanced mixer to be applicable to a variety of circuit architectures, for example, a heterodyne architecture or a homodyne architecture (also known as a zero-IF architecture).

Figure 1:
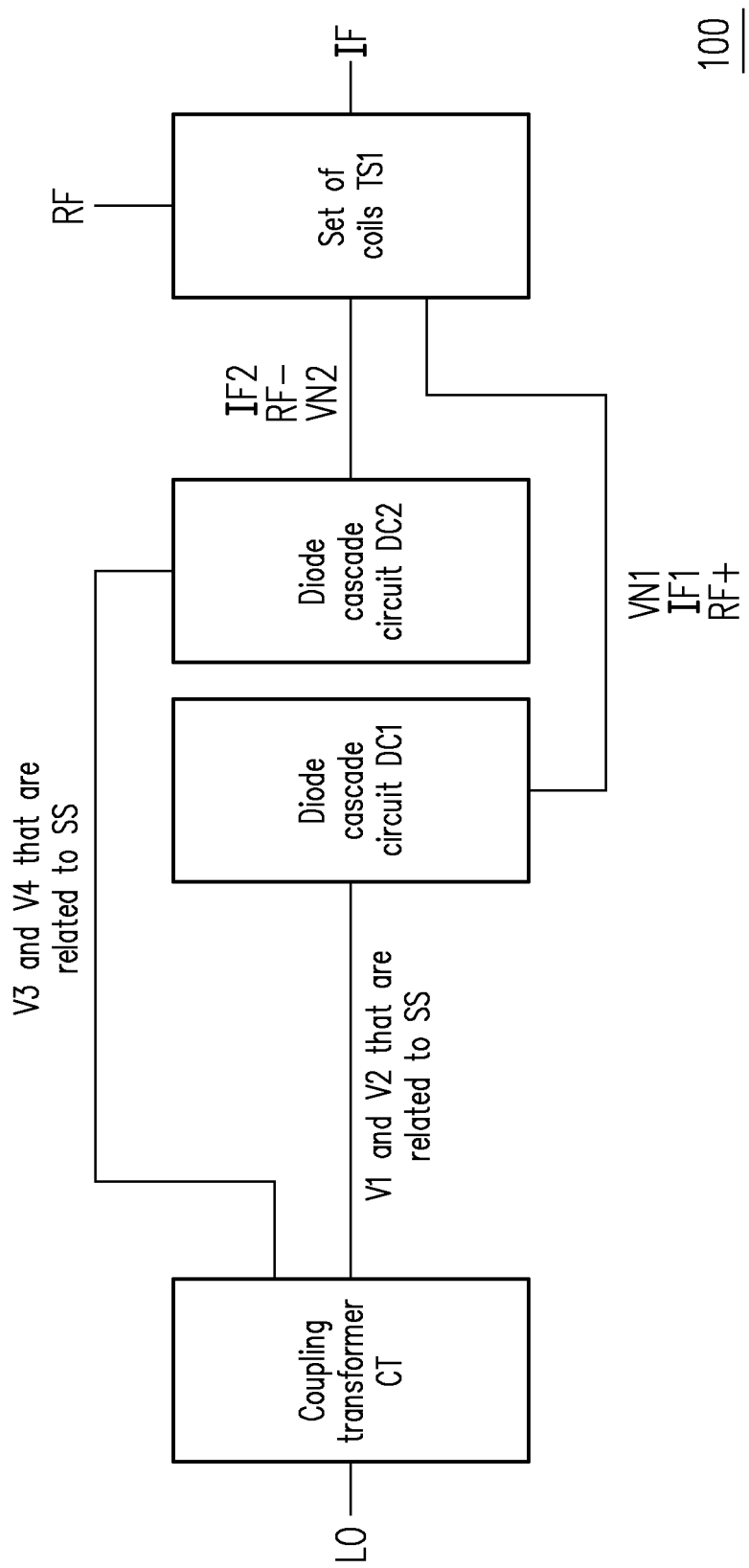
FIG. 1 is a block diagram of a double-balanced mixer according to an embodiment of the disclosure.

FIG. 1 is a block diagram of a double-balanced mixer according to an embodiment of the disclosure. With reference to FIG. 1, a double-balanced mixer 100 includes a coupling transformer CT, a diode cascade circuit DC1, a diode cascade circuit DC2, and a set of coils TS1. The diode cascade circuit DC1 and the diode cascade circuit DC2 are coupled to the coupling transformer CT, and the set of coils TS1 is coupled to the diode cascade circuit DC1 and the diode cascade circuit DC2.

In the embodiment of the disclosure, the coupling transformer CT receives an input signal LO and generates at least one set of signals SS with opposite voltage phases. The diode cascade circuit DC1 receives a voltage signal V1 and a voltage signal V2 that are related to the at least one set of signals SS with opposite voltage phases and a coil end signal RF+ that is related to an input signal RF to generate an output end signal IF1, and generates a node voltage signal VN1 according to a first set of bias voltages. The diode cascade circuit DC2 receives a voltage signal V3 and a voltage signal V4 that are related to the at least one set of signals SS with opposite voltage phases, and a coil end signal RF− that is related to the input signal RF to generate an output end signal IF2, and generates a node voltage signal VN2 according to a second set of bias voltages. The set of coils TS1 is coupled to the diode cascade circuit DC1 to receive the node voltage VN1, and the set of coils TS1 is coupled to the diode cascade circuit DC2 to receive the node voltage VN2. The set of coils TS1 generates the coil end signal RF+ and the coil end signal RF− according to the input signal RF, and generates an output signal IF according to the output end signals IF1 and IF2. The coil end signals RF+ and RF− have opposite voltage phases. In an embodiment, the input signal LO, the output signal IF, the signals SS, the voltage signals V1, V2, V3, and V4, the input signal RF, the coil end signals RF and RF may be AC signals while the first set of bias voltages, the second set of bias voltages, the node voltages VN1 and VN2 may be DC voltages. The first set of bias voltages and the second set of bias voltages may be the same or different from each other.

It is should be noted that in an embodiment, the node voltage VN1 is equal to the node voltage VN2, therefore the double-balanced mixer 100 may omit disposition of an additional capacitor in the output end circuit (for example, set of coils TS1) to block a voltage, thereby reducing the area of the double-balanced mixer 100, and enabling the double-balanced mixer 100 to be applicable to a variety of circuit architectures, especially the homodyne architecture (also known as the zero-IF architecture).

In an embodiment, a frequency of the output signal IF is related to a frequency of the input signal LO and a frequency of the input signal RF. For example, the frequency of the output signal IF is equal to a difference or a sum of the frequency of the input signal LO and the frequency of the input signal RF.

In an embodiment, the double-balanced mixer 100 may also optionally include a DC blocking circuit CC (not shown in FIG. 1), and the DC blocking circuit CC is coupled between the coupling transformer CT, the diode cascade circuit DC1 and the diode cascade circuit DC2, and is configured to block a direct current while allowing an alternating current to pass through, so as to enable the diode cascade circuit DC1 and the diode cascade circuit DC2 to work in an appropriate bias state. Specifically, the DC blocking circuit CC receives the at least one set of signals SS with opposite voltage phases and generates the voltage signal V1, the voltage signal V2, the voltage signal V3, and the voltage signal V4.

Figure 2:
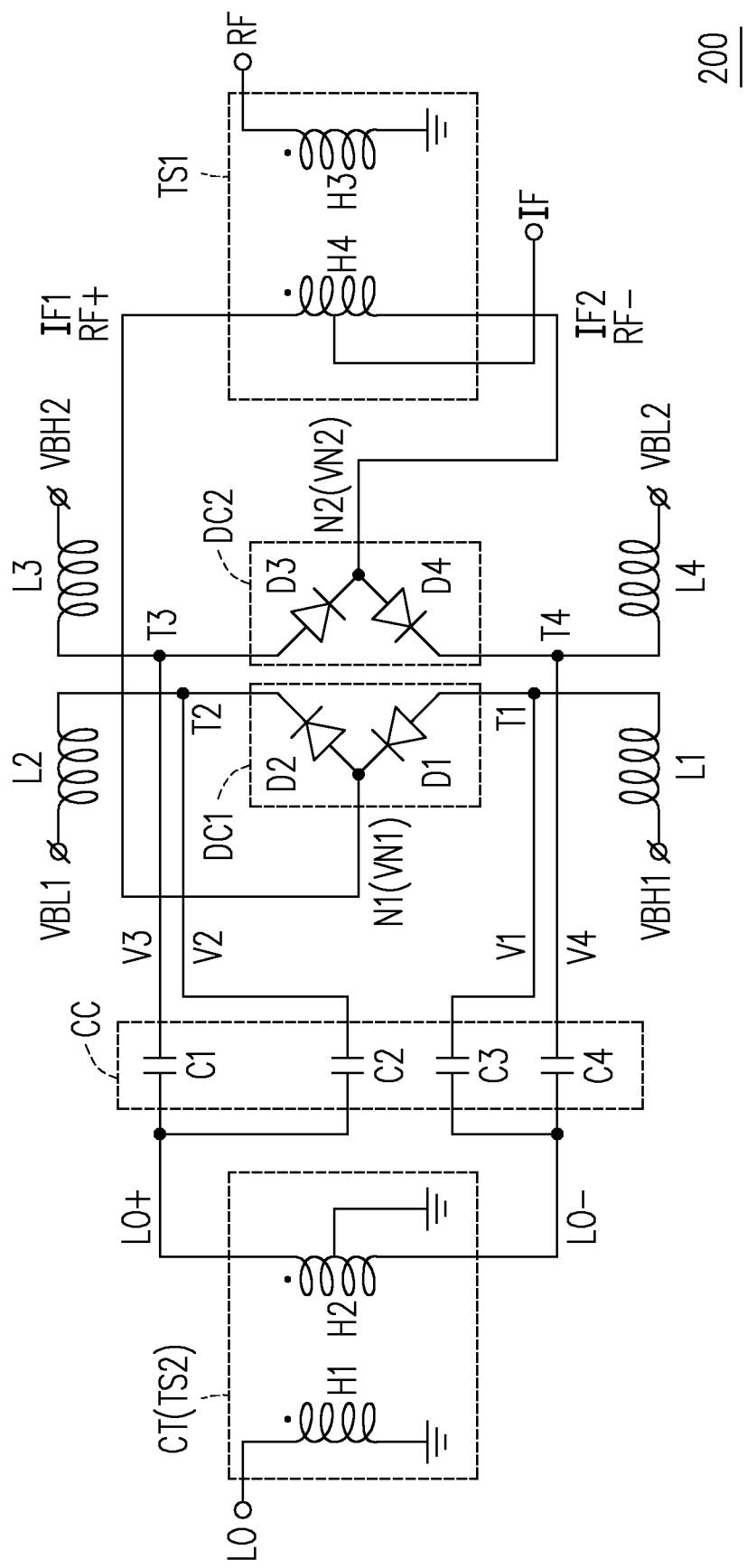
FIG. 2 is a circuit diagram of a double-balanced mixer according to a first embodiment of the disclosure.

FIG. 2 is a circuit diagram of a double-balanced mixer according to a first embodiment of the disclosure. With reference to FIG. 2, a double-balanced mixer 200 in FIG. 2 may be implemented as the double-balanced mixer 100 in FIG. 1. A detailed circuit structure of each element (the coupling transformer CT, the diode cascade circuit DC1, the diode cascade circuit DC2, the set of coils TS1, and the DC blocking circuit CC) of the double-balanced mixer 200 is further described below.

In the embodiment of the disclosure, the coupling transformer CT includes a set of coils TS2. The set of coils TS2 receives the input signal LO and generates the set of signals SS with opposite voltage phases. In particular, the set of signals SS with opposite voltage phases includes a forward signal LO+ and a reverse signal LO−.

In detail, in an embodiment, the set of coils TS2 includes a primary coil H1 and a secondary coil H2. An endpoint of the primary coil H1 receives the input signal LO, and another endpoint is coupled to a reference voltage. A center tap of the secondary coil H2 is coupled to the reference voltage. The set of coils TS2 generates the forward signal LO+ and the reverse signal LO− (that is, the forward signal LO+ is generated at an endpoint of the secondary coil H2, and the reverse signal LO− is generated at another endpoint of the secondary coil H2) according to a turns ratio of the primary coil H1 to the secondary coil H2. In an embodiment, the reference voltage is, for example, a ground level, and is not limited by the disclosure.

In the embodiment of the disclosure, the diode cascade circuit DC1 includes an endpoint T1, an endpoint T2, and a node N1. Specifically, the endpoint T1 receives a high bias voltage VBH1 and the voltage signal V1 that is related to the reverse signal LO−, the endpoint T2 receives a low bias voltage VBL1 and the voltage signal V2 that is related to the forward signal LO+, and the node N1 generates the node voltage VN1 according to the high bias voltage VBH1 and the low bias voltage VBL1. Specifically, the diode cascade circuit DC1 generates the node voltage VN1 according to the first set of bias voltages (the high bias voltage VBH1 and the low bias voltage VBL1), and the node voltage VN1 is equal to half of a sum of the low bias voltage VBL1 and the high bias voltage VBH1.

In an embodiment, the diode cascade circuit DC1 further includes a diode D1 and a diode D2. The diode D1 is coupled between the endpoint T1 and the node N1, an anode of the diode D1 is coupled to the endpoint T1, and a cathode of the diode D1 is coupled to the node N1. The diode D2 is coupled between the endpoint T2 and the node N1, a cathode of the diode D2 is coupled to the endpoint T2, and an anode of the diode D2 is coupled to the node N1. In other words, the first set of bias voltages is used to provide a forward bias voltage to turn on the diodes D1 and D2. In an embodiment, the diode D1 and the diode D2 may be a silicon diode, a polysilicon diode, and is not limited by the disclosure.

In the embodiment of the disclosure, the diode cascade circuit DC2 includes an endpoint T3, an endpoint T4, and a node N2. Specifically, the endpoint T3 receives a high bias voltage VBH2 and the voltage signal V3 that is related to the forward signal LO+, the endpoint T4 receives a low bias voltage VBL2 and the voltage signal V4 that is related to the reverse signal LO−, and the node N2 generates the node voltage VN2 according to the high bias voltage VBH2 and the low bias voltage VBL2. Specifically, the diode cascade circuit DC2 generates the node voltage VN2 according to a second set of bias voltages (the high bias voltage VBH2 and the low bias voltage VBL2), and the node voltage VN2 is equal to half of a sum of the low bias voltage VBL2 and the high bias voltage VBH2.

In an embodiment, the diode cascade circuit DC2 further includes a diode D3 and a diode D4. The diode D3 is coupled between the endpoint T3 and the node N2, an anode of the diode D3 is coupled to the endpoint T3, and a cathode of the diode D3 is coupled to the node N2. The diode D4 is coupled between the endpoint T4 and the node N2, a cathode of the diode D4 is coupled to the endpoint T4, and an anode of the diode D4 is coupled to the node N2. In other words, the second set of bias voltages is used to provide a forward bias voltage to turn on the diodes D3 and D4. In an embodiment, the diode D3 and the diode D4 may be a silicon diode, a polysilicon diode, and is not limited by the disclosure.

How to generate the voltage signal V1 and the voltage signal V4 that are related to the reverse signal LO−, and the voltage signal V2 and the voltage signal V3 that are related to the forward signal LO+ are further described here. In the embodiment of the disclosure, the DC block circuit CC includes a capacitor C1, a capacitor C2, a capacitor C3, and a capacitor C4. The capacitor C1 receives the forward signal LO+ and generates the voltage signal V3, the capacitor C2 receives the forward signal LO+ and generates the voltage signal V2, the capacitor C3 receives the reverse signal LO− and generates the voltage signal V1, and the capacitor C4 receives the reverse signal LO− and generates the voltage signal V4. In detail, the capacitor C1, the capacitor C2, the capacitor C3, and the capacitor C4 are configured to block a direct current while allowing an alternating current to pass through.

In the embodiment of the disclosure, the set of coils TS1 includes a primary coil H3 and a secondary coil H4. An endpoint of the primary coil H3 receives the input signal RF, and another endpoint receives the reference voltage. An endpoint of the secondary coil H4 receives the node voltage VN1, and another endpoint receives the node voltage VN2. The set of coils TS1 generates the coil end signal RF+ at an endpoint of the secondary coil H4 according to the input signal RF inputted at the primary coil H3, and generates the coil end signal RF− at another endpoint of the secondary coil H4. The set of coils TS1 also generates the output signal IF at a center tap of the secondary coil H4 according to the output end signals IF1 and IF2. The diode cascade circuit DC1 receives the voltage signal V1 at the endpoint T1, the voltage signal V2 at the endpoint T2, and receives the coil end signal RF+ at the node N1, so as to generate the output end signal IF1. The diode cascade circuit DC2 receives the voltage signal V3 at the endpoint T3, receives the voltage signal V4 at the endpoint T4, and receives the coil end signal RF− at the node N2, so as to generate the output end signal IF2. In an embodiment, the reference voltage is, for example, the ground level, and is not limited by the disclosure.

It should be noted that in an embodiment, the high bias voltage VBH1 and the low bias voltage VBL1 are respectively inputted to the diode cascade circuit DC1 via an inductance L1 and an inductance L2. In an embodiment, the high bias voltage VBH2 and the low bias voltage VBL2 are respectively inputted to the diode cascade circuit DC2 via an inductance L3 and an inductance L4. The inductance L1, the inductance L2, the inductance L3, and the inductance L4 are configured to block an alternating current while allowing a direct current to pass through. In an embodiment, the low bias voltage VBL1 and the low bias voltage VBL2 are, for example, the ground level, and are not limited by the disclosure.

In an embodiment, the low bias voltage VBL1 is equal to the low bias voltage VBL2, and the high bias voltage VBH1 is equal to the high bias voltage VBH2. In an embodiment, the sum of the low bias voltage VBL1 and the high bias voltage VBH1 is the same as the sum of the low bias voltage VBL2 and the high bias voltage VBH2. Therefore, the node voltage VN1 is equal to the node voltage VN2, so that the diode cascade circuits DC1 and DC2 work in an appropriate state (for example, to prevent occurrence of a leakage current, or to work at a symmetrical conduction voltage to reduce noise generation), thereby enabling the double-balanced mixer 200 to omit disposition of capacitors in the output end circuit to block a voltage, which can reduce an area of the double-balanced mixer 200 and enable the double-balanced mixer 200 to be applicable to a variety of circuit architectures.

Figure 3:
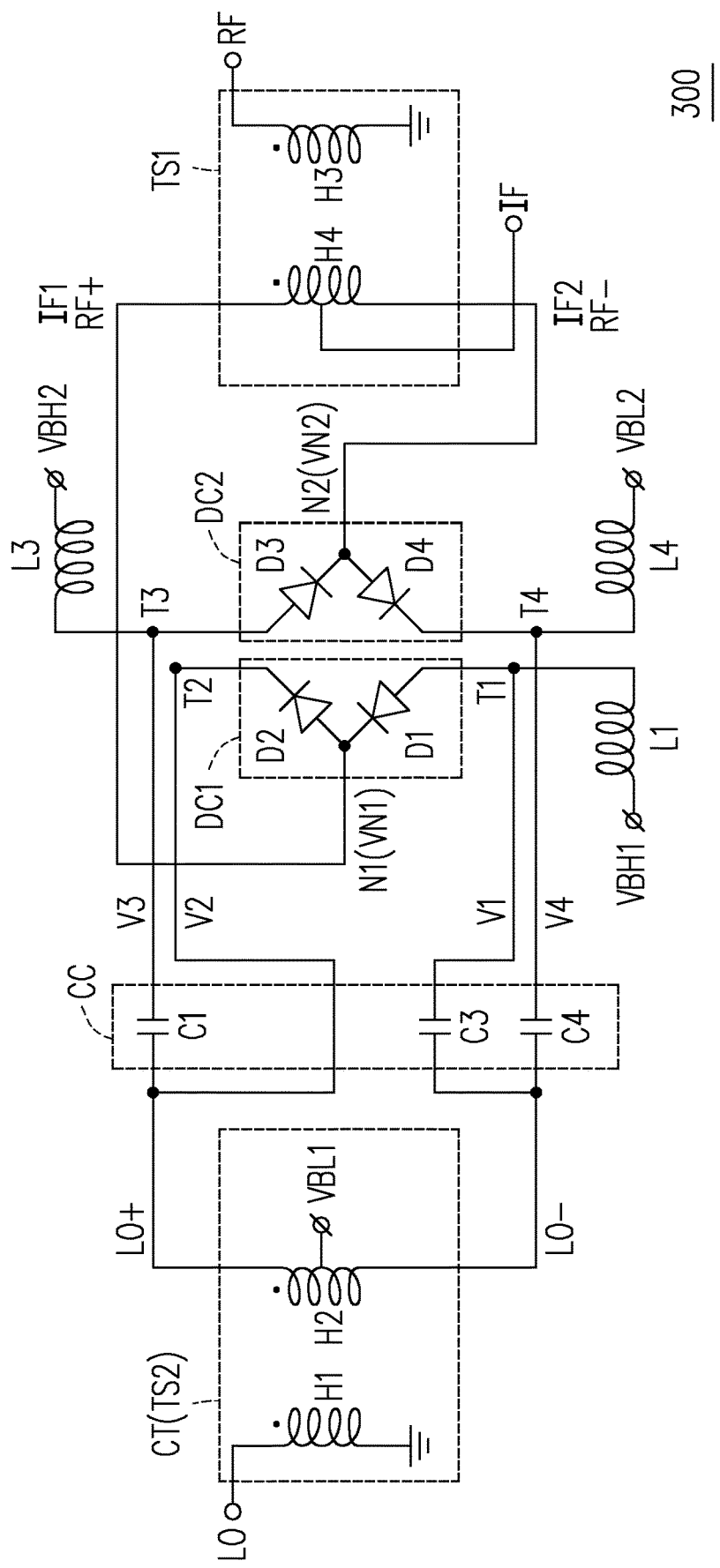
FIG. 3 is a circuit diagram of a double-balanced mixer according to a second embodiment of the disclosure.

FIG. 3 is a circuit diagram of a double-balanced mixer according to a second embodiment of the disclosure. With reference to FIG. 3, a double-balanced mixer 300 in FIG. 3 may be implemented as the double-balanced mixer 100 in FIG. 1. A detailed circuit structure of each element (the coupling transformer CT, the diode cascade circuit DC1, the diode cascade circuit DC2, the set of coils TS1, and the DC blocking circuit CC) of the double-balanced mixer 300 is further described below.

However, it should be noted that the diode cascade circuit DC2 and the set of coils TS1 in FIG. 3 are the same as the diode cascade circuit DC2 and the set of coils TS1 in FIG. 2. Therefore, differences (of the coupling transformer CT, the diode cascade circuit DC1, and the DC blocking circuit CC) are further described as follows.

In the embodiment of the disclosure, the coupling transformer CT includes the set of coils TS2. The set of coils TS2 receives the input signal LO and generates the set of signals SS with opposite voltage phases. In particular, the set of signals SS with opposite voltage phases includes the forward signal LO+ and the reverse signal LO−.

In detail, in an embodiment, the set of coils TS2 includes the primary coil H1 and the secondary coil H2. An endpoint of the primary coil H1 receives the input signal LO, and the other endpoint is coupled to the reference voltage. The center tap of the secondary coil H2 is coupled to the low bias voltage VBL1. The set of coils TS2 generates the forward signal LO+ and the reverse signal LO− (that is, the forward signal LO+ is generated at an endpoint of the secondary coil H2, and the reverse signal LO− is generated at the other endpoint of the secondary coil H2) according to the turns ratio of primary coil H1 to the secondary coil H2. In an embodiment, the reference voltage is, for example, the ground level, and is not limited by the disclosure.

In the embodiment of the disclosure, the diode cascade circuit DC1 includes the endpoint T1, the endpoint T2, and the node N1. The endpoint T1 receives the high bias voltage VBH1 and the voltage signal V1 that is related to the reverse signal LO−, the endpoint T2 receives the voltage signal V2 that is related to the forward signal LO+, and the node N1 generates the node voltage VN1 according to the high bias voltage VBH1 and the low bias voltage VBL1. Specifically, the voltage signal V2 is the forward signal LO+, the diode cascade circuit DC1 generates the node voltage VN1 according to the first set of bias voltages (the high bias voltage VBH1 and the low bias voltage VBL1), and the node voltage VN1 is equal to half of the sum of the low bias voltage VBL1 and the high bias voltage VBH1.

In an embodiment, the diode cascade circuit DC1 further includes the diode D1 and the diode D2. The diode D1 is coupled between the endpoint T1 and the node N1, the anode of the diode D1 is coupled to the endpoint T1, and the cathode of the diode D1 is coupled to the node N1. The diode D2 is coupled between the endpoint T2 and the node N1, the cathode of the diode D2 is coupled to the endpoint T2, and the anode of the diode D2 is coupled to the node N1. In other words, the first set of bias voltages are used to provide the forward bias voltage to turn on the diodes D1 and D2.

How to generate the voltage signal V1 and the voltage signal V4 that are related to the reverse signal LO−, and the voltage signal V3 that is related to the forward signal LO are further described here. In the embodiment of the disclosure, the DC block circuit CC includes the capacitor C1, the capacitor C3, and the capacitor C4. The capacitor C1 receives the forward signal LO+ and generates the voltage signal V3, the capacitor C3 receives the reverse signal LO− and generates the voltage signal V1, and the capacitor C4 receives the reverse signal LO− and generates the voltage signal V4. In detail, the capacitor C1, the capacitor C3, and the capacitor C4 are configured to block a direct current while allowing an alternating current to pass through.

It should be noted that in an embodiment, the high bias voltage VBH1 is inputted to the diode cascade circuit DC1 via the inductance L1, and the inductance L1 is configured to block an alternating current while allowing a direct current to pass through.

In an embodiment, the low bias voltage VBL1 is equal to the low bias voltage VBL2, and the high bias voltage VBH1 is equal to the high bias voltage VBH2. In an embodiment, the sum of the low bias voltage VBL1 and the high bias voltage VBH1 is the same as the sum of the low bias voltage VBL2 and the high bias voltage VBH2. Therefore, the node voltage VN1 is equal to the node voltage VN2, enabling the double-balanced mixer 300 to omit disposition of the capacitors in the output end circuit to block the voltage, which can reduce an area of the double-balanced mixer 300 and enable the double-balanced mixer 300 to be applicable to a variety of circuit architectures.

Figure 4:
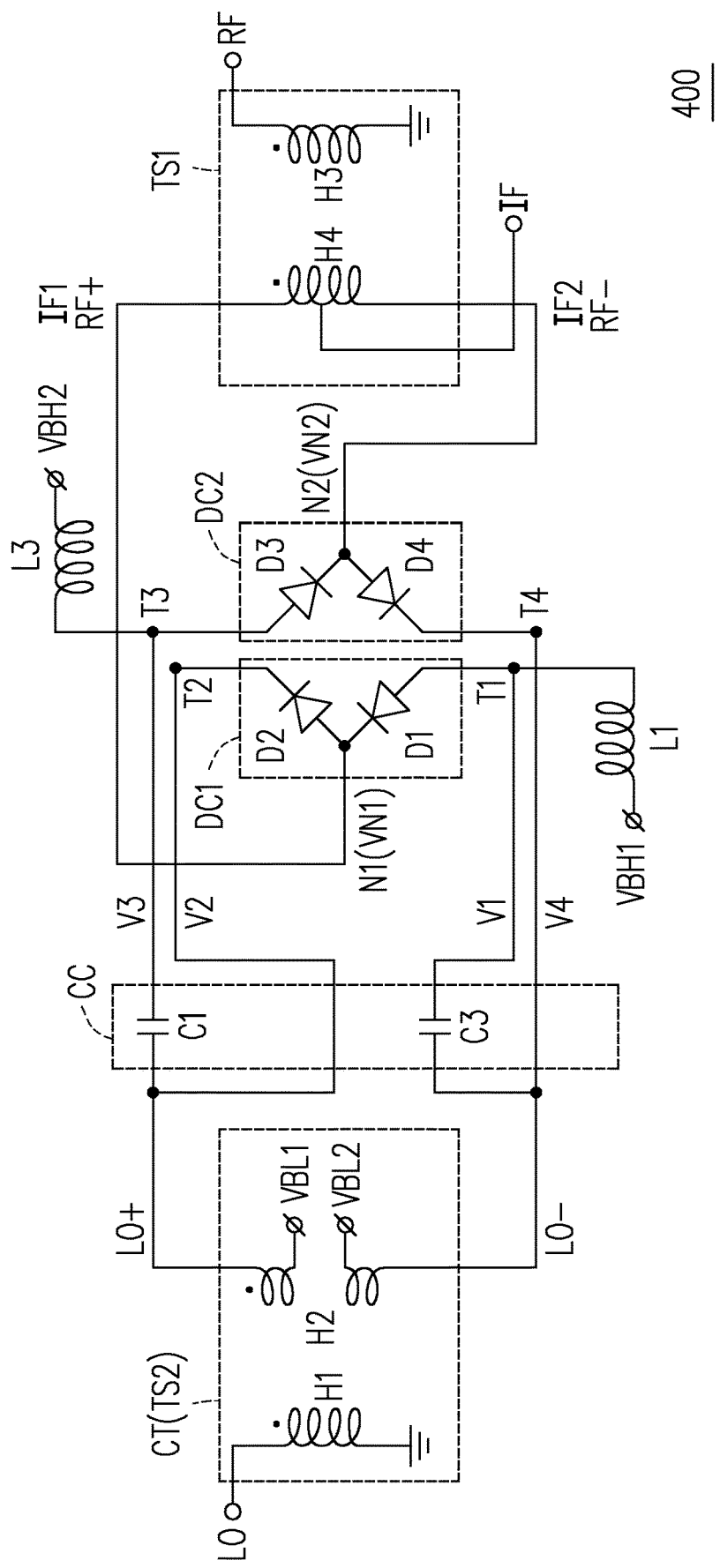
FIG. 4 is a circuit diagram of a double-balanced mixer according to a third embodiment of the disclosure.

FIG. 4 is a circuit diagram of a double-balanced mixer according to a third embodiment of the disclosure. With reference to FIG. 4, a double-balanced mixer 400 in FIG. 4 may be implemented as the double-balanced mixer 100 in FIG. 1. A detailed circuit structure of each element (the coupling transformer CT, the diode cascade circuit DC1, the diode cascade circuit DC2, the set of coils TS1, and the DC blocking circuit CC) of the double-balanced mixer 400 is further described below.

However, it should be noted that the diode cascade circuit DC1 in FIG. 4 is the same as the diode cascade circuit DC1 in FIG. 3, and the set of coils TS1 in FIG. 4 is the same as the set of coils TS1 in FIG. 2. Therefore, differences (of the coupling transformer CT, the diode cascade circuit DC2, and the DC blocking circuit CC) are further described as follows.

In the embodiment of the disclosure, the coupling transformer CT includes the set of coils TS2. The set of coils TS2 receives the input signal LO and generates the set of signals SS with opposite voltage phases. In particular, the set of signals SS with opposite voltage phases includes the forward signal LO+ and the reverse signal LO−.

In detail, in an embodiment, the set of coils TS2 includes the primary coil H1 and the secondary coil H2. An endpoint of the primary coil H1 receives the input signal LO, and the other endpoint is coupled to the reference voltage. The secondary coil H2 includes a first portion coil and a second portion coil. An endpoint of the first portion coil receives the low bias voltage VBL1, and an endpoint of the second portion coil receives the low bias voltage VBL2. The set of coils TS2 generates the forward signal LO+ and the reverse signal LO− (that is, the forward signal LO is generated at another endpoint of the first portion coil of the secondary coil H2, and the reverse signal LO is generated at another endpoint of the second portion coil of the secondary coil H2) according to a turns ratio of the primary coil H1 to the first portion coil and the second portion coil of the secondary coil H2.

In the embodiment of the disclosure, the diode cascade circuit DC2 includes the endpoint T3, the endpoint T4, and the node N2. The endpoint T3 receives the high bias voltage VBH2 and the voltage signal V3 that is related to the forward signal LO+, the endpoint T4 receives the voltage signal V4 that is related to the reverse signal LO−, and the node N2 generates the node voltage VN2 according to the high bias voltage VBH2 and the low bias voltage VBL2. Specifically, the voltage signal V4 is the reverse signal LO−, the diode cascade circuit DC2 generates the node voltage VN2 according to the second set of bias voltages (the high bias voltage VBH2 and the low bias voltage VBL2), and the node voltage VN2 is equal to half of the sum of the low bias voltage VBL2 and the high bias voltage VBH2.

In an embodiment, the diode cascade circuit DC2 further includes the diode D3 and the diode D4. The diode D3 is coupled between the endpoint T3 and the node N2, the anode of the diode D3 is coupled to the endpoint T3, and the cathode of the diode D3 is coupled to the node N2. The diode D4 is coupled between the endpoint T4 and the node N2, the cathode of the diode D4 is coupled to the endpoint T4, and the anode of the diode D4 is coupled to the node N2. In other words, the second set of bias voltages is used to provide the forward bias voltage to turn on the diodes D3 and D4.

How to generate the voltage signal V1 that is related to the reverse signal LO− and the voltage signal V3 that is related to the forward signal LO+ are further described here. In the embodiment of the disclosure, the DC block circuit CC includes the capacitor C1 and the capacitor C3. The capacitor C1 receives the forward signal LO+ and generates the voltage signal V3, and the capacitor C3 receives the reverse signal LO− and generates the voltage signal V1. In detail, the capacitor C1 and the capacitor C3 are configured to block a direct current while allowing an alternating current to pass through.

It should be noted that in an embodiment, the high bias voltage VBH2 is inputted to the diode cascade circuit DC2 via the inductance L3, and the inductance L3 is configured to block an alternating current while allowing a direct current to pass through.

In an embodiment, the low bias voltage VBL1 is equal to the low bias voltage VBL2, and the high bias voltage VBH1 is equal to the high bias voltage VBH2. In an embodiment, the sum of the low bias voltage VBL1 and the high bias voltage VBH1 is the same as the sum of the low bias voltage VBL2 and the high bias voltage VBH2. Therefore, the node voltage VN1 is equal to the node voltage VN2, enabling the double-balanced mixer 400 to omit disposition of the capacitors in the output end circuit to block the voltage, which can reduce an area of the double-balanced mixer 400 and enable the double-balanced mixer 400 to be applicable to a variety of circuit architectures.

Figure 5:
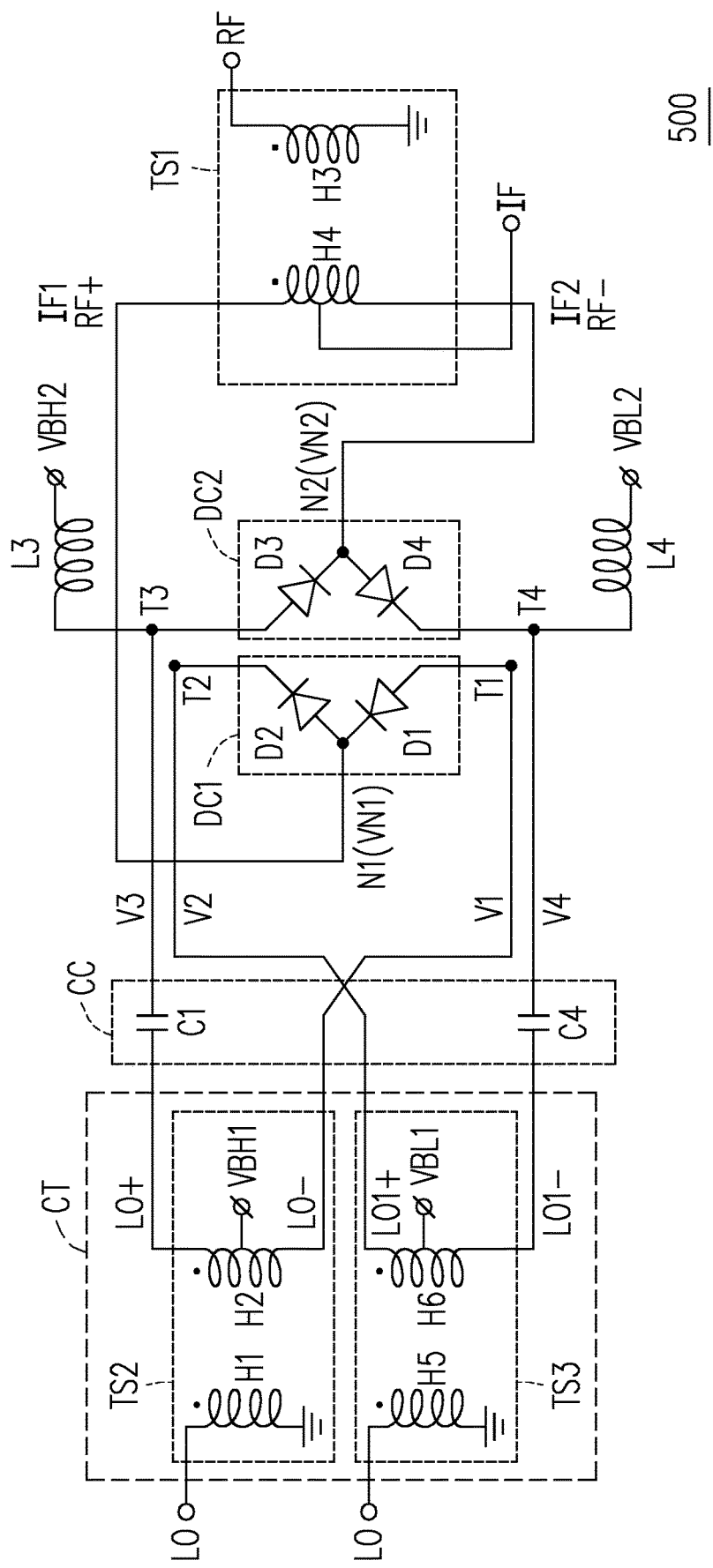
FIG. 5 is a circuit diagram of a double-balanced mixer according to a fourth embodiment of the disclosure.

FIG. 5 is a circuit diagram of a double-balanced mixer according to a fourth embodiment of the disclosure. With reference to FIG. 5, a double-balanced mixer 500 in FIG. 5 may be implemented as the double-balanced mixer 100 in FIG. 1. A detailed circuit structure of each element (the coupling transformer CT, the diode cascade circuit DC1, the diode cascade circuit DC2, the set of coils TS1, and the DC blocking circuit CC) of the double-balanced mixer 500 is further described below.

However, it should be noted that the set of coils TS1 in FIG. 5 is the same as the set of coils TS1 in FIG. 2. Therefore, differences (of the coupling transformer CT, the diode cascade circuit DC1, the diode cascade circuit DC2, and the DC blocking circuit CC) are further described as follows.

In the embodiment of the disclosure, the coupling transformer CT includes the set of coils TS2 and a set of coils TS3. The set of coils TS2 receives the input signal LO and generates the set of signals SS with opposite voltage phases. The set of signals SS with opposite voltage phases includes the forward signal LO+ and the reverse signal LO−. The set of coils TS3 receives the input signal LO and generates another set of signals SS with opposite voltage phases. The another set of signals SS with opposite voltage phases includes a forward signal LO1+ and a reverse signal LO1−.

In detail, in an embodiment, the set of coils TS2 includes the primary coil H1 and the secondary coil H2. An endpoint of the primary coil H1 receives the input signal LO, and the other endpoint is coupled to the reference voltage. The center tap of the secondary coil H2 is coupled to the high bias voltage VBH1. The set of coils TS2 generates the forward signal LO+ and the reverse signal LO− (that is, the forward signal LO+ is generated at an endpoint of the secondary coil H2, and the reverse signal LO− is generated at the other endpoint of the secondary coil H2) according to the turns ratio of the primary coil H1 to the secondary coil H2. In an embodiment, the reference voltage is, for example, the ground level, and is not limited by the disclosure.

Moreover, in an embodiment, the set of coils TS3 includes a primary coil H5 and a secondary coil H6. An endpoint of the primary coil H5 receives the input signal LO, and another endpoint is coupled to the reference voltage. A center tap of the secondary coil H6 is coupled to the low bias voltage VBL1. The set of coils TS3 generates the forward signal LO1+ and the reverse signal LO1− (that is, the forward signal LO1+ is generated at an endpoint of the secondary coil H6, and the reverse signal LO1− is generated another endpoint of the secondary coil H6) according to a turns ratio of the primary coil H5 to the secondary coil H6. In an embodiment, the reference voltage is, for example, the ground level, and is not limited by the disclosure.

In the embodiment of the disclosure, the diode cascade circuit DC1 includes the endpoint T1, the endpoint T2, and the node N1. The endpoint T1 receives the voltage signal V1 that is related to the reverse signal LO−, the endpoint T2 receives the voltage signal V2 that is related to the forward signal LO1+, and the node N1 generates the node voltage VN1 according to the high bias voltage VBH1 and the low bias voltage VBL1. Specifically, the voltage signal V1 is the reverse signal LO−, the voltage signal V2 is the forward signal LO1+, the diode cascade circuit DC1 generates the node voltage VN1 according to the first set of bias voltages (the high bias voltage VBH1 and the low bias voltage VBL1), and the node voltage VN1 is equal to half of the sum of the low bias voltage VBL1 and the high bias voltage VBH1.

In an embodiment, the diode cascade circuit DC1 further includes the diode D1 and the diode D2. The diode D1 is coupled between the endpoint T1 and the node N1, the anode of the diode D1 is coupled to the endpoint T1, and the cathode of the diode D1 is coupled to the node N1. The diode D2 is coupled between the endpoint T2 and the node N1, the cathode of the diode D2 is coupled to the endpoint T2, and the anode of the diode D2 is coupled to the node N1. In other words, the first set of bias voltages are configured to provide the forward bias voltage to turn on the diodes D1 and D2.

In the embodiment of the disclosure, the diode cascade circuit DC2 includes the endpoint T3, the endpoint T4, and the node N2. The endpoint T3 receives the high bias voltage VBH2 and the voltage signal V3 that is related to the forward signal LO+, the endpoint T4 receives the low bias voltage VBL2 and the voltage signal V4 that is related to the reverse signal LO1−, and the node N2 generates the node voltage VN2 according to the high bias voltage VBH2 and the low bias voltage VBL2. Specifically, the diode cascade circuit DC2 generates the node voltage VN2 according to the second set of bias voltages (the high bias voltage VBH2 and the low bias voltage VBL2), and the node voltage VN2 is equal to half of the sum of the low bias voltage VBL2 and the high bias voltage VBH2.

In an embodiment, the diode cascade circuit DC2 further includes the diode D3 and the diode D4. The diode D3 is coupled between the endpoint T3 and the node N2, the anode of the diode D3 is coupled to the endpoint T3, and the cathode of the diode D3 is coupled to the node N2. The diode D4 is coupled between the endpoint T4 and the node N2, the cathode of the diode D4 is coupled to the endpoint T4, and the anode of the diode D4 is coupled to the node N2. In other words, the second set of bias voltages is configured to provide the forward bias voltage to turn on the diodes D3 and D4.

How to generate the voltage signal V3 that is related to the forward signal LO+ and the voltage signal V4 that is related to the reverse signal LO1− are further described here. In the embodiment of the disclosure, the DC block circuit CC includes the capacitor C1 and the capacitor C4. The capacitor C1 receives the forward signal LO+ and generates the voltage signal V3, and the capacitor C4 receives the reverse signal LO1− and generates the voltage signal V4. In detail, the capacitor C1 and the capacitor C4 are configured to block a direct current while allowing an alternating current to pass through.

It should be noted that in an embodiment, the high bias voltage VBH2 and the low bias voltage VBL2 are respectively inputted to the diode cascade circuit DC2 via the inductance L3 and the inductance L4. The inductance L3 and the inductance L4 are configured to block an alternating current while allowing a direct current to pass through. In an embodiment, the low bias voltage VBL1 and the low bias voltage VBL2 are, for example, the ground level, and are not limited by the disclosure.

In an embodiment, the low bias voltage VBL1 is equal to the low bias voltage VBL2, and the high bias voltage VBH1 is equal to the high bias voltage VBH2. In an embodiment, the sum of the low bias voltage VBL1 and the high bias voltage VBH1 is the same as the sum of the low bias voltage VBL2 and the high bias voltage VBH2. Therefore, the node voltage VN1 is equal to the node voltage VN2, enabling the double-balanced mixer 500 to omit disposition of the capacitors in the output end circuit to block the voltage, which can reduce an area of the double-balanced mixer 500 and enable the double-balanced mixer 500 to be applicable to a variety of circuit architectures.

Figure 6:
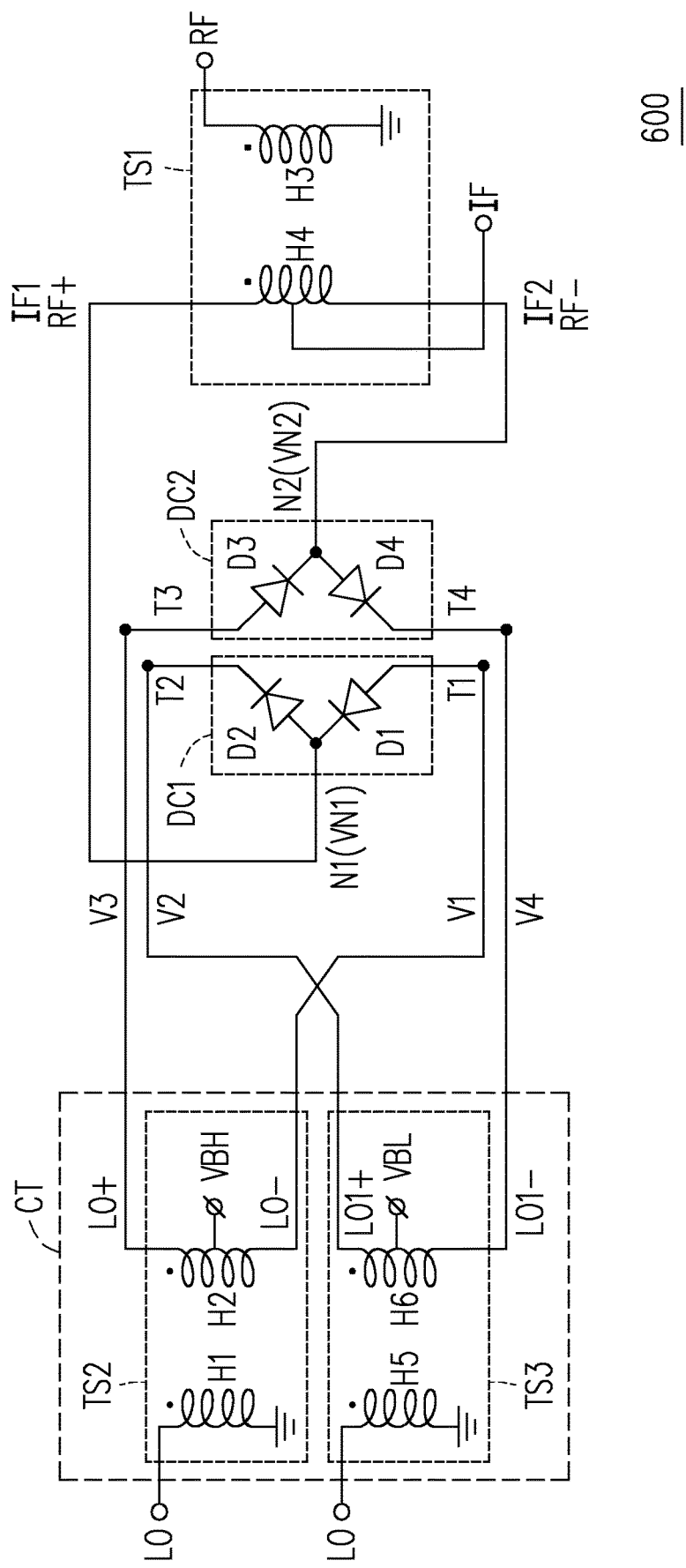
FIG. 6 is a circuit diagram of a double-balanced mixer according to a fifth embodiment of the disclosure.

FIG. 6 is a circuit diagram of a double-balanced mixer according to a fifth embodiment of the disclosure. With reference to FIG. 6, a double-balanced mixer 600 in FIG. 6 may be implemented as the double-balanced mixer 100 in FIG. 1. A detailed circuit structure of each element (the coupling transformer CT, the diode cascade circuit DC1, the diode cascade circuit DC2, and the set of coils TS1) of the double-balanced mixer 600 is further described below.

However, it should be noted that the set of coils TS1 in FIG. 6 is the same as the set of coils TS1 in FIG. 2. Therefore, differences (of the coupling transformer CT, the diode cascade circuit DC1, and the diode cascade circuit DC2) are further described as follows.

In the embodiment of the disclosure, the coupling transformer CT includes the set of coils TS2 and the set of coils TS3. The set of coils TS2 receives the input signal LO and generates the set of signals SS with opposite voltage phases. The set of signals SS with opposite voltage phases includes the forward signal LO+ and the reverse signal LO−. The set of coils TS3 receives the input signal LO and generates the another set of signals SS with opposite voltage phases. The another set of signals SS with opposite voltage phases includes the forward signal LO1+ and the reverse signal LO1−.

In detail, in an embodiment, the set of coils TS2 includes the primary coil H1 and the secondary coil H2. An endpoint of the primary coil H1 receives the input signal LO, and the other endpoint is coupled to the reference voltage. The center tap of the secondary coil H2 is coupled to a high bias voltage VBH. The set of coils TS2 generates the forward signal LO+ and the reverse signal LO− (that is, the forward signal LO+ is generated at an endpoint of the secondary coil H2, and the reverse signal LO− is generated at the other endpoint of the secondary coil H2) according to the turns ratio of the primary coil H1 to the secondary coil H2. In an embodiment, the reference voltage is, for example, the ground level, and is not limited by the disclosure.

Moreover, in an embodiment, the set of coils TS3 includes the primary coil H5 and the secondary coil H6. An endpoint of the primary coil H5 receives the input signal LO, and the other endpoint is coupled to the reference voltage. The center tap of the secondary coil H6 is coupled to a low bias voltage VBL. The set of coils TS3 generates the forward signal LO1+ and the reverse signal LO1− (that is, the forward signal LO1+ is generated at an endpoint of the secondary coil H6, and the reverse signal LO1− is generated at the other endpoint of the secondary coil H6) according to a turns ratio of the primary coil H5 to the secondary coil H6. In an embodiment, the reference voltage is, for example, the ground level, and is not limited by the disclosure.

In the embodiment of the disclosure, the diode cascade circuit DC1 includes the endpoint T1, the endpoint T2, and the node N1. The endpoint T1 receives the voltage signal V1 that is related to the reverse signal LO−, the endpoint T2 receives the voltage signal V2 that is related to the forward signal LO1+, and the node N1 generates the node voltage VN1 according to the high bias voltage VBH and the low bias voltage VBL. Specifically, the voltage signal V1 is the reverse signal LO−, the voltage signal V2 is the forward signal LO1+, the diode cascade circuit DC1 generates the node voltage VN1 according to a first set of bias voltages (the high bias voltage VBH and the low bias voltage VBL), and the node voltage VN1 is equal to half of a sum of the low bias voltage VBL and the high bias voltage VBH.

In an embodiment, the diode cascade circuit DC1 further includes the diode D1 and the diode D2. The diode D1 is coupled between the endpoint T1 and the node N1, the anode of the diode D1 is coupled to the endpoint T1, and the cathode of the diode D1 is coupled to the node N1. The diode D2 is coupled between the endpoint T2 and the node N1, the cathode of the diode D2 is coupled to the endpoint T2, and the anode of the diode D2 is coupled to the node N1. In other words, the first set of bias voltages are configured to provide a forward bias voltage to turn on the diodes D1 and D2.

In the embodiment of the disclosure, the diode cascade circuit DC2 includes the endpoint T3, the endpoint T4, and the node N2. The endpoint T3 receives the voltage signal V3 that is related to the forward signal LO+, the endpoint T4 receives the voltage signal V4 that is related to the reverse signal LO1−, and the node N2 generates the node voltage VN2 according to the high bias voltage VBH and the low bias voltage VBL. Specifically, the voltage signal V3 is the forward signal LO+, the voltage signal V4 is the reverse signal LO1−, the diode cascade circuit DC2 generates the node voltage VN2 according to a second set of bias voltages (the high bias voltage VBH and the low bias voltage VBL), and the node voltage VN2 is equal to half of the sum of the low bias voltage VBL and the high bias voltage VBH.

In an embodiment, the diode cascade circuit DC2 further includes the diode D3 and the diode D4. The diode D3 is coupled between the endpoint T3 and the node N2, the anode of the diode D3 is coupled to the endpoint T3, and the cathode of the diode D3 is coupled to the node N2. The diode D4 is coupled between the endpoint T4 and the node N2, the cathode of the diode D4 is coupled to the endpoint T4, and the anode of the diode D4 is coupled to the node N2. In other words, the second set of bias voltages is configured to provide a forward bias voltage to turn on the diodes D3 and D4.

Based on the circuit architecture of the double-balanced mixer 600 in FIG. 6, since the node voltage VN1 is equal to the node voltage VN2, disposition of the capacitors in the output end circuit of the double-balanced mixer 600 to block the voltage may be omitted, thereby reducing an area of the double-balanced mixer 600, and enabling the double-balanced mixer 600 to be applicable to a variety of circuit architectures.

Figure 7:
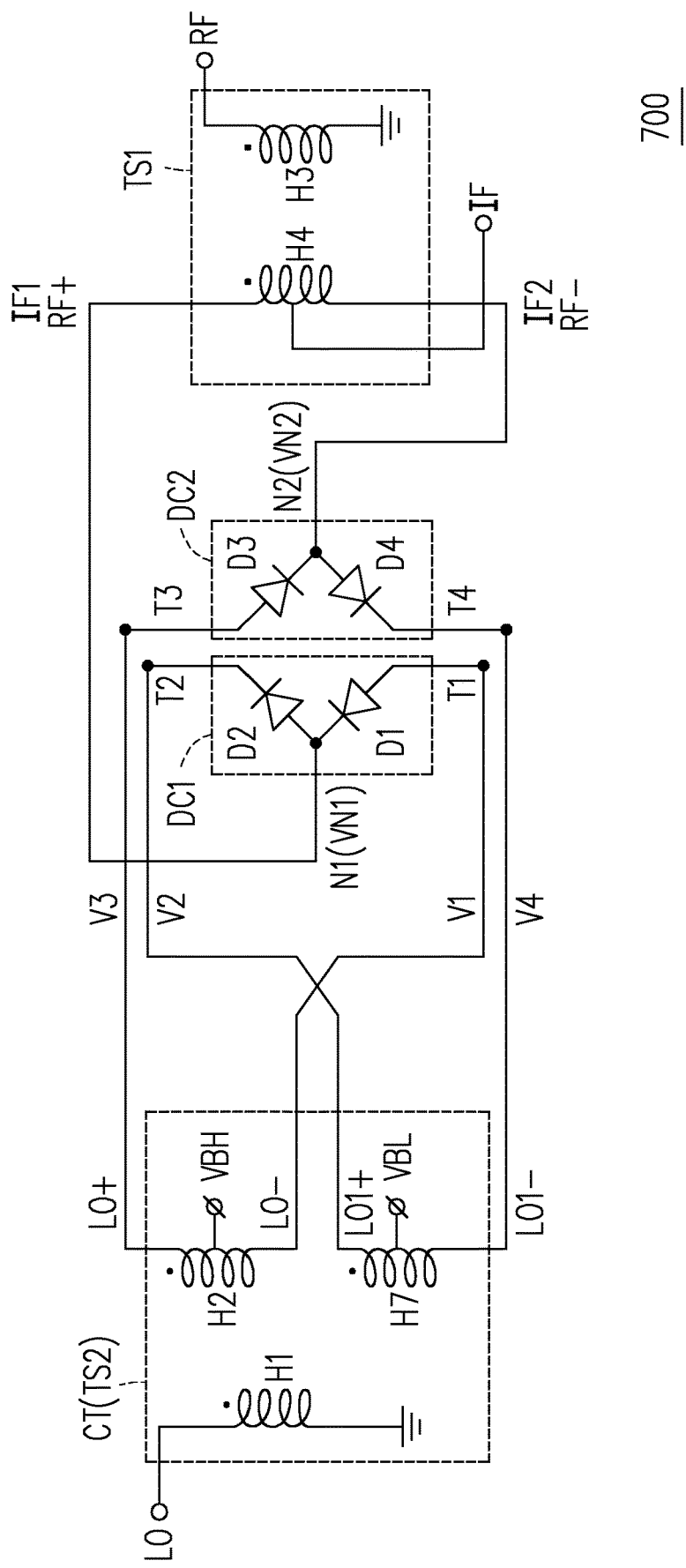
FIG. 7 is a circuit diagram of a double-balanced mixer according to a sixth embodiment of the disclosure.

FIG. 7 is a circuit diagram of a double-balanced mixer according to a sixth embodiment of the disclosure. With reference to FIG. 7, a double-balanced mixer 700 in FIG. 7 may be implemented as the double-balanced mixer 100 in FIG. 1. A detailed circuit structure of each element (the coupling transformer CT, the diode cascade circuit DC1, the diode cascade circuit DC2, and the set of coils TS1) of the double-balanced mixer 700 is further described below.

However, it should be noted that the diode cascade circuit DC1 and the diode cascade circuit DC2 in FIG. 7 are the same as the diode cascade circuit DC1 and the diode cascade circuit DC2 in FIG. 6, and the set of coils TS1 in FIG. 7 is the same as the set of coils in FIG. 2. Therefore, differences (of the coupling transformer CT) are further described as follows.

In the embodiment of the disclosure, the coupling transformer CT includes the set of coils TS2. The set of coils TS2 receives the input signal LO and generates the set of signals SS with opposite voltage phases and the another set of signals SS with opposite voltage phases. In particular, the set of signals SS with opposite voltage phases includes the forward signal LO+ and the reverse signal LO−, and the another set of signals SS with opposite voltage phases includes the forward signal LO1+ and the reverse signal LO1−.

In detail, in an embodiment, the set of coils TS2 includes the primary coil H1, the secondary coil H2, and a secondary coil H7. An endpoint of the primary coil H1 receives the input signal LO, and the other endpoint is coupled to the reference voltage. The center tap of the secondary coil H2 is coupled to the high bias voltage VBH, and a center tap of the secondary coil H7 is coupled to the low bias voltage VBL. The set of coils TS2 generates the forward signal LO+, the reverse signal LO−, the forward signal LO1+, and the reverse signal LO1− (that is, the forward signal LO+ is generated at an endpoint of the secondary coil H2, and the reverse signal LO− is generated at the other endpoint of the secondary coil H6, and the forward signal LO1+ is generated at an endpoint of the secondary coil H7, and the reverse signal LO1− is generated at another endpoint of the secondary coil H7) according to a turns ratio of the primary coil H1 to the secondary coil H2 and the secondary coil H7. In an embodiment, the reference voltage is, for example, the ground level, and is not limited by the disclosure.

Based on the circuit architecture of the double-balanced mixer 700 in FIG. 7, since the node voltage VN1 is equal to the node voltage VN2, disposition of the capacitors in the output end circuit of the double-balanced mixer 700 to block the voltage may be omitted, thereby reducing an area of the double-balanced mixer 700, and enabling the double-balanced mixer 700 to be applicable to a variety of circuit architectures.

It should be noted that in some cases, the output signal IF of a double-balanced mixer may not only include an output voltage Vif that is related to frequency, but also other unwanted DC interference and AC interference, such as a DC common mode voltage Vcm generated from the multiple bias voltages and a AC noise voltage Vnoise generated from the multiple bias voltages, which is a considerable design issue for a double-balanced mixer that applies a bias voltage. Therefore, improvements to address the above-mentioned issue are further proposed below.

Figure 8:
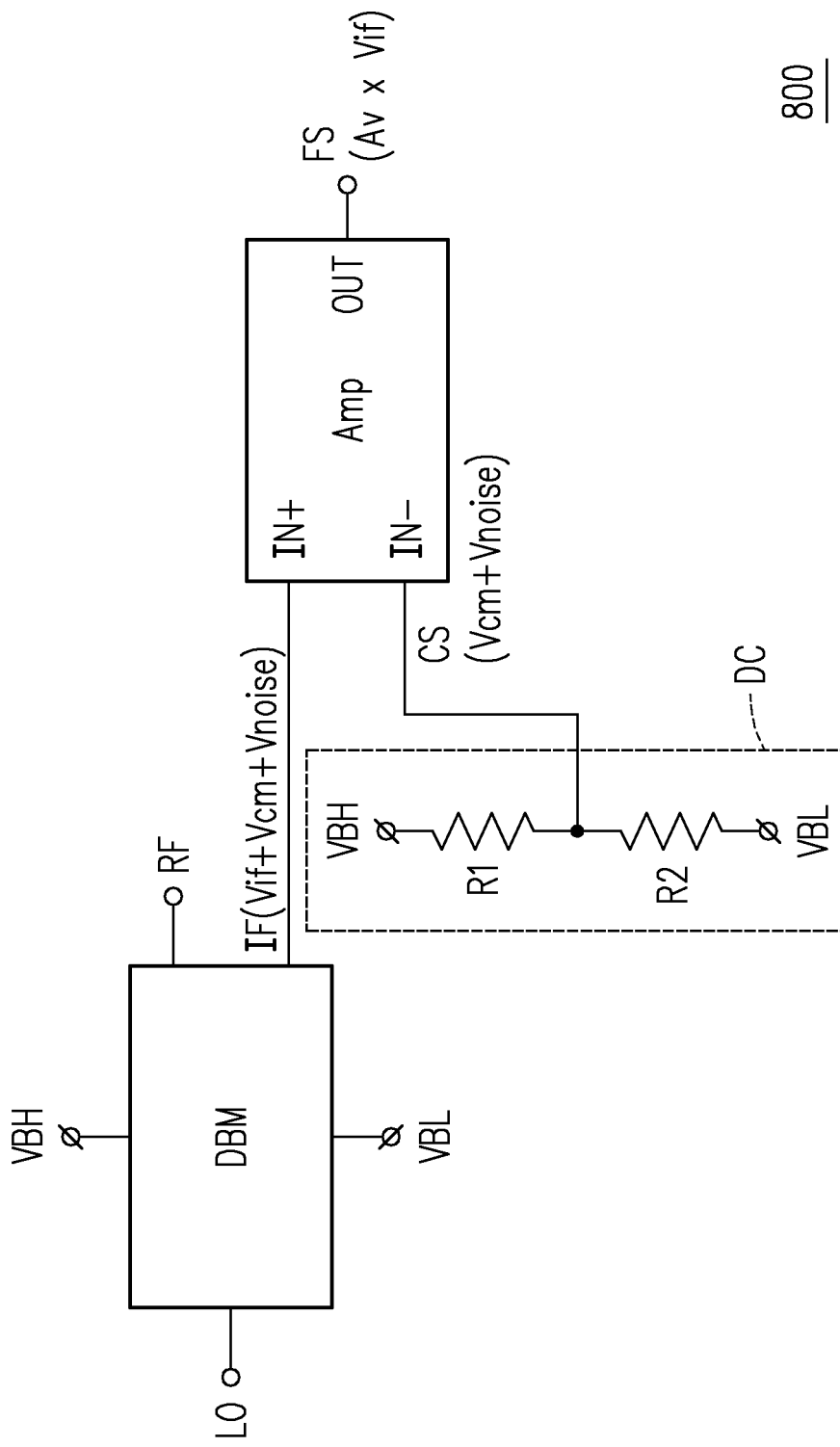
FIG. 8 is a circuit diagram of a mixer circuit having a noise suppression function according to the first embodiment of the disclosure.

FIG. 8 is a circuit diagram of a mixer circuit having a noise suppression function according to the first embodiment of the disclosure. With reference to FIG. 8, a circuit 800 in FIG. 8 includes a mixer, especially a diode mixer (for example, a double-balanced mixer DBM), a voltage divider circuit DC, and an amplifier Amp. In an embodiment, the double-balanced mixer DBM may be any one of the double-balanced mixers 200 to 700 in FIGS. 2 to 7, or another double-balanced mixer, including multiple diodes, that uses at least one set of bias voltages for forward biasing the multiple diodes. In the embodiment of the disclosure, any one of the double-balanced mixers 200 to 700 and the voltage divider circuit DC are coupled to the amplifier Amp.

In the embodiment of the disclosure, any one of the double-balanced mixers 200 to 700 receives at least one set of bias voltages, such as the high bias voltage VBH and the low bias voltage VBL. In detail, in an embodiment, the high bias voltage VBH and the low bias voltage VBL provide a first turn-on bias voltage to the diode cascade circuit DC1 and a second turn-on bias voltage to the diode cascade circuit DC2. In the embodiment in which the double-balanced mixer receives the first set of bias voltages and the second set of bias voltages, the first set of bias voltages and the second set of bias voltages may be the same as each other. That is, the high bias voltage VBH is equal to the high bias voltage VBH1 and the high bias voltage VBH2, and the low bias voltage VBL is equal to the low bias voltage VBL1 and the low bias voltage VBL2. In other words, the high bias voltage VBH1 and the high bias voltage VBH2 received by the double-balanced mixer may be provided by the high bias voltage VBH, and the low bias voltage VBL1 and the low bias voltage VBL2 received by the double-balanced mixer may be provided by the low bias voltage VBL.

In the embodiment of the disclosure, the voltage divider circuit DC receives the at least one set of bias voltages, such as the high bias voltage VBH and the low bias voltage VBL, and generates a common mode signal CS at an output end. In particular, the common mode signal CS includes a common mode voltage Vcm and a noise voltage Vnoise, so as to suppress the common mode voltage Vcm and the noise voltage Vnoise in the output signal IF.

Specifically, in an embodiment, the voltage divider circuit DC includes a resistor R1 and a resistor R2. The resistor R2 is coupled to the resistor R1 in series, an endpoint of the resistor R1 receives the high bias voltage VBH, an endpoint of the resistor R2 receives the low bias voltage VBL, another endpoint of the resistor R1 and another endpoint of the resistor R2 are coupled to the output end of the voltage divider circuit DC, so as to generate the common mode signal CS at the output end of the voltage divider circuit DC.

In the embodiment of the disclosure, the amplifier Amp has an input end IN+ and an input end IN−. The input end IN is coupled to an output end of the set of coils TS1 to receive the output signal IF, and the input end IN− is coupled to the output end of the voltage divider circuit DC to receive the common mode signal CS and generates a final output signal FS at an output end OUT.

In detail, in an embodiment, the amplifier Amp multiplies a voltage difference (Vif) between the output signal IF received at the input end IN+ and the common mode signal CS received at the input end IN− by Av times, so as to amplify the output signal IF (that is, the final output signal FS) after noise suppression. In an embodiment, the amplifier Amp is, for example, an intermediate frequency amplifier, and is not limited by the disclosure.

Figure 9:
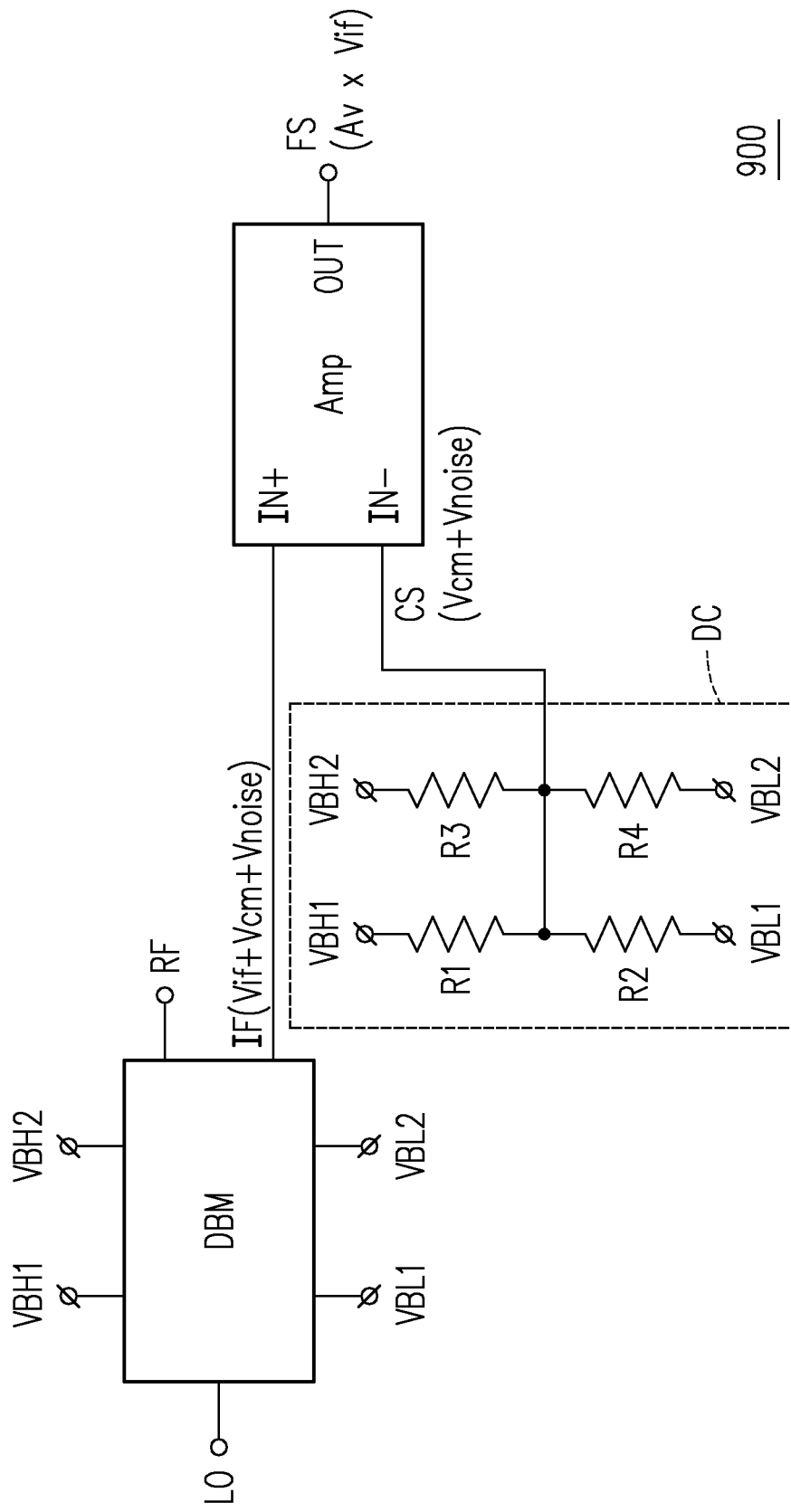
FIG. 9 is a circuit diagram of a mixer circuit having a noise suppression function according to the second embodiment of the disclosure.

FIG. 9 is a circuit diagram of a mixer circuit having a noise suppression function according to a second embodiment of the disclosure. With reference to FIG. 9, a circuit 900 in FIG. 9 is similar to the circuit 800 in FIG. 8, except for differences in any one of the double-balanced mixers 200 to 700, a number of bias voltages received by another double-balanced mixer that uses at least one set of bias voltages, or a circuit structure of the voltage divider circuit DC. Therefore, only the above differences are described below.

In the embodiment of the disclosure, any one of the double-balanced mixers 200 to 700 receives the at least one set of bias voltages, for example, two sets of bias voltages, which include the high bias voltage VBH1, the high bias voltage VBH2, the low bias voltage VBL1 and the low bias voltage VBL2. In detail, in an embodiment, the high bias voltage VBH1 and the low bias voltage VBL1 provide the first turn-on bias voltage to the diode cascade circuit DC1, and the high bias voltage VBH2 and the low bias voltage VBL2 provide the second turn-on bias voltage to the diode cascade circuit DC2.

In the embodiment of the disclosure, the voltage divider circuit DC receives the high bias voltage VBH1, the high bias voltage VBH2, the low bias voltage VBL1, and the low bias voltage VBL2, and generates the common mode signal CS at the output end. In particular, the common mode signal CS includes the common mode voltage Vcm and the noise voltage Vnoise, so as to suppress the common mode voltage Vcm and the noise voltage Vnoise in the output signal IF.

Specifically, in an embodiment, the voltage divider circuit DC includes the resistor R1, the resistor R2, a resistor R3, and a resistor R4. The resistor R2 is coupled to the resistor R1 in series, and the resistor R4 is coupled to the resistor R3 in series. An endpoint of the resistor R1 receives the high bias voltage VBH1, an endpoint of the resistor R2 receives the low bias voltage VBL1, an endpoint of the resistor R3 receives the high bias voltage VBH2, an endpoint of the resistor R4 receives the low bias voltage VBL2, and the other endpoint of the resistor R1, the other endpoint of the resistor R2, another endpoint of the resistor R3, and another endpoint of the resistor R4 are coupled to the output end of the voltage divider circuit DC, so as to generate the common mode signal CS at the output end of the voltage divider circuit DC.

In addition, it should be noted that in some cases, the output signal IF of a mixer, especially a diode mixer (for example, a double-balanced mixer) may not only include the output voltage Vif, the common mode voltage Vcm, and the noise voltage Vnoise, but also includes a DC bias voltage Vos generated due to feedthrough (because of the limited RF/LO isolation) from an input signal LO port to an input signal RF port. The DC bias voltage Vos after being amplified by the amplifier Amp causes dynamic range degradation, therefore an improvement to address the above issue is further proposed below.

Figure 10:
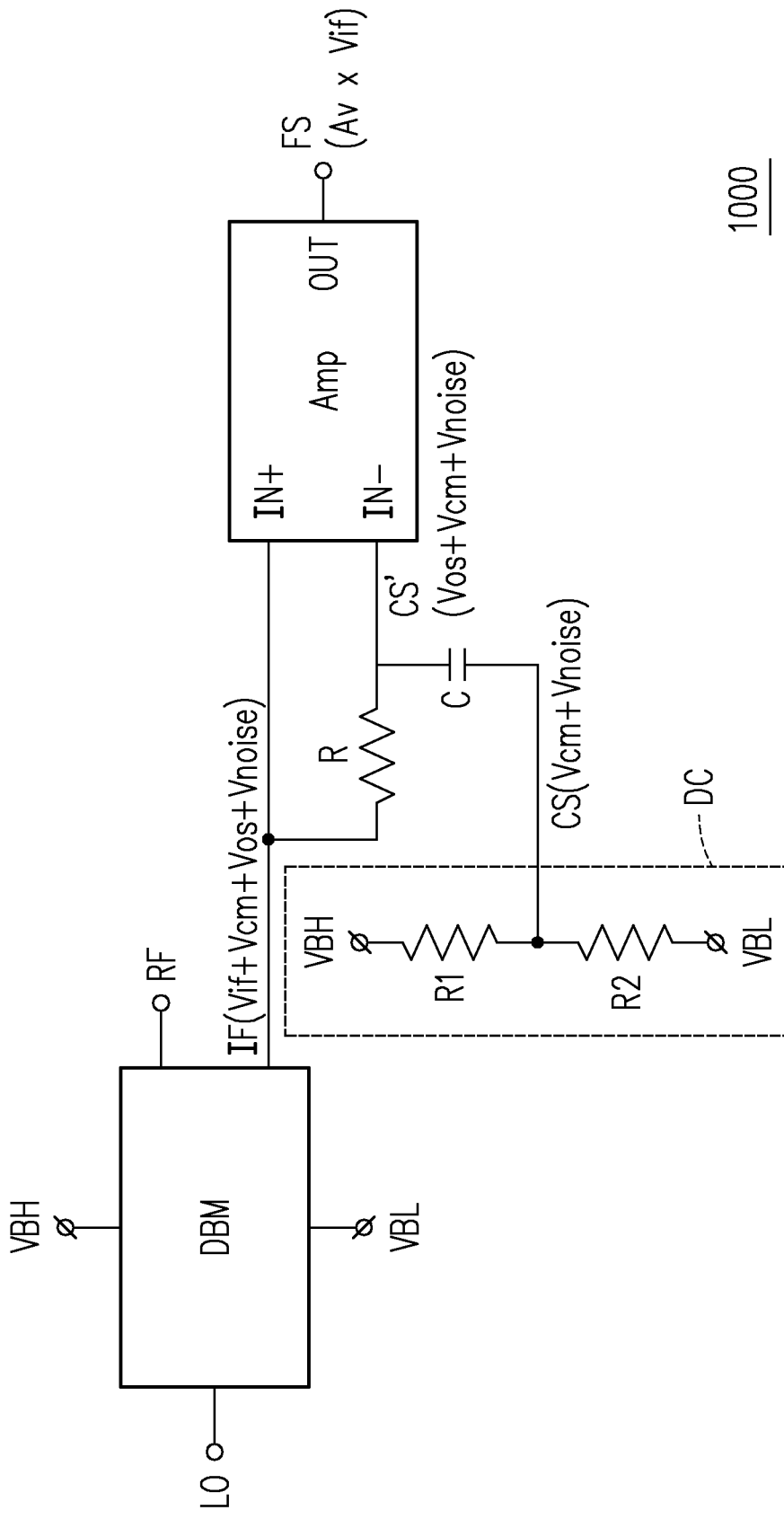
FIG. 10 is a circuit diagram of a mixer circuit having a noise suppression function according to the third embodiment of the disclosure.

FIG. 10 is a circuit diagram of a mixer circuit having a noise suppression function according to a third embodiment of the disclosure. With reference to FIG. 10, a circuit 1000 in FIG. 10 is similar to the circuit 800 in FIG. 8, except for a difference in which the circuit 1000 also includes an AC impedance element (a resistor R) and a DC impedance element (a capacitor C). Therefore, only the difference is further described below. In particular, in an embodiment, the AC impedance element may also be an inductance, and is not limited by the disclosure.

In the embodiment of the disclosure, an endpoint of the resistor R is coupled to an output end of any one of the double-balanced mixers 200 to 700 to receive the output signal IF, and an endpoint of the capacitor C is coupled to the output end of the voltage divider circuit DC to receive the common mode signal CS, and another endpoint of the capacitor C and another endpoint of the resistor R are both coupled to the input end IN− of the amplifier Amp, so as to generate a common mode signal CS' at the input end IN− of the amplifier Amp.

Specifically, in an embodiment, the resistor R filters out the DC bias voltage Vos of the output signal IF and inputs the DC bias voltage Vos to the input end IN− of the amplifier Amp, so as to eliminate the DC bias voltage Vos in the output signal IF. In an embodiment, the capacitor C inputs the common mode signal CS (the common mode voltage Vcm and the noise voltage Vnoise) to the input end IN− of the amplifier Amp, so as to eliminate the common mode voltage Vcm and the noise voltage Vnoise in the output signal IF.

In summary, the double-balanced mixer provided by the embodiments of the disclosure increases the sensitivity of the double-balanced mixer even when the diode with the higher turn-on voltage is used and omits the disposition of the capacitors in the output end circuit by using the dual-path bias diode, thereby reducing the area of the double-balanced mixer, and enabling the double-balanced mixer to be applicable to a variety of circuit architectures. In addition, in the mixer circuit provided by the embodiments of the disclosure, the mixer (for example, the double-balanced mixer) is also coupled to the voltage divider circuit and the amplifier, and the amplifier uses the common mode signal of the voltage divider circuit to suppress the noise in the output signal of the mixer.

Although the disclosure has been described with reference to the above-mentioned embodiments, it is not intended to be exhaustive or to limit the disclosure to the precise form or to exemplary embodiments disclosed. It is apparent to one of ordinary skill in the art that modifications to the described embodiments may be made without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A mixer circuit, comprising:
   a diode mixer, comprising a plurality of diodes, and configured to receive a first input signal, a second input signal, and at least one set of bias voltages for forward biasing the plurality of diodes, and generate an output signal, wherein a frequency of the output signal is related to a frequency of the first input signal and a frequency of the second input signal;
   a voltage divider circuit, configured to receive the at least one set of bias voltages and generate a common mode signal at an output end; and
   an amplifier, having a first input end coupled to the diode mixer to receive the output signal, and a second input end coupled to the output end of the voltage divider circuit, and configured to suppress noise in the output signal, and generate a final output signal.

2. The mixer circuit according to claim 1, wherein the at least one set of bias voltages comprises a high bias voltage and a low bias voltage.

3. The mixer circuit according to claim 2, wherein the voltage divider circuit comprises:
   a first resistor; and
   a second resistor, coupled to the first resistor in series,
   wherein an end of the first resistor receives the high bias voltage, an end of the second resistor receives the low bias voltage, another end of the first resistor and another end of the second resistor are coupled to the output end of the voltage divider circuit.

4. The mixer circuit according to claim 2, wherein the plurality of diodes comprises a first diode cascade circuit and a second diode cascade circuit, and the high bias voltage and the low bias voltage are configured to provide the first diode cascade circuit with a first turn-on bias voltage and the second diode cascade circuit with a second turn-on bias voltage.

5. The mixer circuit according to claim 1, further comprising:
   an AC impedance element, wherein an end of the AC impedance element receives the output signal; and
   a DC impedance element, wherein an end of the DC impedance element is coupled to the output end of the voltage divider circuit, and another end is coupled to another end of the AC impedance element and the second input end of the amplifier.

6. The mixer circuit according to claim 1, wherein the at least one set of bias voltages comprises a first set of bias voltages and a second set of bias voltages, the first set of bias voltages further comprises a first high bias voltage and a first low bias voltage, and the second set of bias voltages further comprises a second high bias voltage and a second low bias voltage.

7. The mixer circuit according to claim 6, wherein the voltage divider circuit comprises:
   a first resistor;
   a second resistor, coupled to the first resistor in series;
   a third resistor; and
   a fourth resistor, coupled to the third resistor in series,
   wherein an end of the first resistor receives the first high bias voltage, an end of the second resistor receives the first low bias voltage, an end of the third resistor receives the second high bias voltage, an end of the fourth resistor receives the second low bias voltage, and another end of the first resistor, another end of the second resistor, another end of the third resistor, and another end of the fourth resistor are coupled to the output end of the voltage divider circuit.

8. The mixer circuit according to claim 6, wherein the plurality of diodes comprises a first diode cascade circuit and a second diode cascade circuit, and the first high bias voltage, the second high bias voltage, the first low bias voltage and the second low bias voltage are configured to provide the first diode cascade circuit with a first turn-on bias voltage and the second diode cascade circuit with a second turn-on bias voltage.

9. The mixer circuit according to claim 1, wherein the diode mixer comprises a double-balanced mixer.

10. The mixer circuit according to claim 9, wherein the double-balanced mixer, comprises:
    a coupling transformer, configured to receive the first input signal and generate at least one set of signals with opposite voltage phases;
    a first diode cascade circuit, coupled to the coupling transformer and configured to receive a first voltage signal and a second voltage signal that are related to the at least one set of signals with opposite voltage phases, and a first coil end signal that is related to the second input signal, so as to generate a first output end signal, and generate a first node voltage according to a first set of bias voltages;
    a second diode cascade circuit, coupled to the coupling transformer and configured to receive a third voltage signal and a fourth voltage signal that are related to the at least one set of signals with opposite voltage phases, and a second coil end signal that is related to the second input signal, so as to generate a second output end signal, and generate a second node voltage according to a second set of bias voltages; and
    a first set of coils, coupled to the first diode cascade circuit to receive the first node voltage and coupled to the second diode cascade circuit to receive the second node voltage, and configured to generate the first coil end signal and the second coil end signal according to the second input signal, and generate the output signal according to the first output end signal and the second output end signal, wherein the first node voltage is equal to the second node voltage, and the at least one set of bias voltages comprises the first set of bias voltages and the second set of bias voltages.

11. The mixer circuit according to claim 10, wherein the double-balanced mixer further comprises:
a DC blocking circuit, coupled between the coupling transformer and the first diode cascade circuit and the second diode cascade circuit, and configured to receive the at least one set of signals with opposite voltage phases and generate the first voltage signal, the second voltage signal, the third voltage signal, and the fourth voltage signal.

12. The mixer circuit according to claim 11, wherein the coupling transformer comprises:
a second set of coils, configured to receive the first input signal and generate the at least one set of signals with opposite voltage phases, wherein the at least one set of signals with opposite voltage phases comprises a first forward signal and a first reverse signal.

13. The mixer circuit according to claim 12, wherein the second set of coils comprises:
a first primary coil, wherein an endpoint of the first primary coil receives the first input signal, and another endpoint is coupled to a reference voltage; and
a first secondary coil, wherein a center tap of the first secondary coil is coupled to the reference voltage or a first low bias voltage,
wherein the second set of coils generates the first forward signal and the first reverse signal according to the first primary coil and the first secondary coil.

14. The mixer circuit according to claim 12, wherein the second set of coils comprises:
a first primary coil, wherein an endpoint of the first primary coil receives the first input signal, and another endpoint is coupled to a reference voltage; and
a first secondary coil, comprising a first portion coil and a second portion coil, wherein an endpoint of the first portion coil receives a first low bias voltage, and an endpoint of the second portion coil receives a second low bias voltage,
wherein the second set of coils generates the first forward signal and the first reverse signal according to the first primary coil, and the first portion coil and the portion second coil of the first secondary coil.

15. The mixer circuit according to claim 11, wherein the coupling transformer comprises:
a second set of coils, configured to receive the first input signal and generate a first set of signals with opposite voltage phases, wherein the first set of signals with opposite voltage phases comprises a first forward signal and a first reverse signal; and
a third set of coils, configured to receive the first input signal and generate a second set of signals with opposite voltage phases, wherein the second set of signals with opposite voltage phases comprises a second forward signal and a second reverse signal.

16. The mixer circuit according to claim 15, wherein the second set of coils comprises:
a first primary coil, wherein an endpoint of the first primary coil receives the first input signal, and another endpoint is coupled to a reference voltage; and
a first secondary coil, wherein a center tap of the first secondary coil is coupled to a first high bias voltage,
wherein the second set of coils generates the first forward signal and the first reverse signal according to the first primary coil and the first secondary coil, and
the third set of coils comprises:
a second primary coil, wherein an endpoint of the second primary coil receives the first input signal, and another endpoint is coupled to the reference voltage; and
a second secondary coil, wherein a center tap of the second secondary coil is coupled to a first low bias voltage,
wherein the third set of coils generates the second forward signal and the second reverse signal according to the second primary coil and the second secondary coil.

17. The mixer circuit according to claim 10, wherein the coupling transformer comprises:
a second set of coils, configured to receive the first input signal and generate a first set of signals with opposite voltage phases, wherein the first set of signals with opposite voltage phases comprises a first forward signal and a first reverse signal; and
a third set of coils, configured to receive the first input signal and generate a second set of signals with opposite voltage phases, wherein the second set of signals with opposite voltage phases comprises a second forward signal and a second reverse signal.

18. The mixer circuit according to claim 17, wherein the second set of coils comprises:
a first primary coil, wherein an endpoint of the first primary coil receives the first input signal, and another endpoint is coupled to a reference voltage; and
a first secondary coil, wherein a center tap of the first secondary coil is coupled to a high bias voltage,
wherein the second set of coils generates the first forward signal and the first reverse signal according to the first primary coil and the first secondary coil, and
the third set of coils comprises:
a second primary coil, wherein an endpoint of the second primary coil receives the first input signal, and another endpoint is coupled to the reference voltage; and
a second secondary coil, wherein a center tap of the second secondary coil is coupled to a low bias voltage,
wherein the third set of coils generates the second forward signal and the second reverse signal according to the second primary coil and the second secondary coil.

19. The mixer circuit according to claim 10, wherein the coupling transformer comprises:
a second set of coils, configured to receive the first input signal and generate a first set of signals with opposite voltage phases and a second set of signals with opposite voltage phases, wherein the first set of signals with opposite voltage phases comprises a first forward signal and a first reverse signal, and the second set of signals with opposite voltage phases comprises a second forward signal and a second reverse signal.

20. The mixer circuit according to claim 10, wherein the first set of coils comprises:
a first primary coil, wherein an endpoint of the first primary coil receives the second input signal, and another endpoint receives a reference voltage; and a first secondary coil, wherein an endpoint of the first secondary coil receives the first node voltage, and another endpoint receives the second node voltage, a first secondary coil, wherein an endpoint of the first secondary coil receives the first node voltage and is configured to generate the first coil end signal according to the second input signal, and another endpoint receives the second node voltage and is configured to generate the second coil end signal according to the second input signal, wherein the first set of coils generates the output signal at a center tap of the first secondary coil according to the first primary coil and the first secondary coil.

* * * * *